US011139673B2

(12) United States Patent
Chen et al.

(10) Patent No.: US 11,139,673 B2
(45) Date of Patent: Oct. 5, 2021

(54) BATTERY-CHARGING SYSTEM AND CONTROL STRATEGY

(71) Applicant: Ford Global Technologies, LLC, Dearborn, MI (US)

(72) Inventors: Hanyang Chen, Canton, MI (US); Michael J. Irby, Monroe, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 190 days.

(21) Appl. No.: 16/589,785

(22) Filed: Oct. 1, 2019

(65) Prior Publication Data

US 2021/0099007 A1  Apr. 1, 2021

(51) Int. Cl.
*F02N 11/08* (2006.01)
*H02J 7/14* (2006.01)
*F02D 29/06* (2006.01)
*G01R 31/382* (2019.01)

(52) U.S. Cl.
CPC ............ *H02J 7/1469* (2013.01); *F02D 29/06* (2013.01); *F02N 11/0825* (2013.01); *G01R 31/382* (2019.01); *F02D 2200/0404* (2013.01); *F02D 2200/503* (2013.01); *F02D 2200/602* (2013.01); *F02N 2200/061* (2013.01)

(58) Field of Classification Search
CPC ............... H02J 7/1469; F02N 11/0825; F02N 2200/061; F02D 29/06; F02D 2200/0404; F02D 2200/602; F02D 2200/503; G01R 31/382

USPC ..... 123/399, 179.3, 179.4, 179.18; 701/103; 290/40 F, 50; 903/903, 905, 906, 907
See application file for complete search history.

(56) References Cited

U.S. PATENT DOCUMENTS 6,809,501 B2    10/2004  Kapsokavathis et al.
7,062,916 B2 *   6/2006  Kamijo ................. B60W 20/13
                                                       60/706
9,902,277 B2    2/2018   Keller et al.

* cited by examiner

*Primary Examiner* — Hai H Huynh
(74) *Attorney, Agent, or Firm* — David B Kelley; Brooks Kushman P.C.

(57) ABSTRACT

A vehicle includes an engine having a throttle body, a battery, e.g., a 12-volt battery, and a battery-charging system electrically connected to the battery and configured to convert mechanical motion of the engine into electricity to charge the battery. A controller of the vehicle is programmed to, in response to an opening of the throttle body being less than an opening threshold and a state of charge of the battery (battery SOC) being less than a first charge threshold, set the battery-charging system to output a first power, wherein the charge threshold is based on a measured capacity of the battery and a measured key-off load. The controller is further programmed to, in response to the opening being less than the opening threshold and the battery SOC exceeding the first charge threshold but being less than a second charge threshold, set the battery-charging system to output a second power that is less than the first power.

20 Claims, 3 Drawing Sheets ism and Control Strategy

BATTERY-CHARGING SYSTEM AND CONTROL STRATEGY

TECHNICAL FIELD

This disclosure relates to automotive battery-charging systems and more specifically to charging strategies that charge the battery according to a dynamically calculated battery state of charge threshold that is based on a measure battery capacity of the battery and a measured key-off load of the vehicle.

BACKGROUND

Automotive vehicles include a 12-volt (V) battery for starting the engine and powering accessory loads. Operation of the vehicle depletes the battery, and a battery-charging system is used to recharge the battery. The battery-charging system includes an alternator that is typically powered by the engine. The alternator converts mechanical motion into electricity for recharging the battery and providing power to vehicle accessory loads.

SUMMARY

According to one embodiment, a vehicle includes an engine having a throttle body, a battery, e.g., a 12-volt battery, and a battery-charging system electrically connected to the battery and configured to convert mechanical motion of the engine into electricity to charge the battery and to provide power for vehicle electric loads. A controller of the vehicle is programmed to, in response to an opening of the throttle body being less than an opening threshold and a state of charge of the battery (battery SOC) being less than a first charge threshold, set the battery-charging system to output a first power, wherein the charge threshold is based on a measured capacity of the battery and a measured key-off load. The controller is further programmed to, in response to the opening being less than the opening threshold and the battery SOC exceeding the first charge threshold but being less than a second charge threshold, set the battery-charging system to output a second power that is less than the first power.

According to one embodiment, a vehicle includes an engine, a battery having a predetermined rated capacity, and a battery-charging system. A controller is programmed to calculate a minimum battery state of charge (SOC) threshold based on a measured capacity of the battery and a measured key-off load of the vehicle. The controller is further programmed to, in response to a SOC of the battery exceeding the minimum threshold, set an output voltage of the battery-charging system according to a first charging strategy that sets the output voltage based on efficiency of the engine, wherein the efficiency of the engine is based on at least throttle-body opening and accelerator-pedal position. The efficiency of the engine may be further based brake-pedal position in some embodiments. The controller is also programmed to, in response to the SOC of the battery being less than the minimum threshold, set another output voltage of the battery-charging system according to a second charging strategy that is independent of the efficiency of the engine.

According to yet another embodiment, a vehicle includes an engine, a battery having a predetermined rated capacity, a battery-charging system electrically connected to the battery and configured to convert mechanical motion of the engine into electricity to charge the battery, and a controller. The controller is programmed to receive one or more signals indicative of a measured battery capacity and a measured key-off load. The controller is further programmed to, in response to an efficiency of the engine that is based on throttle-body opening and accelerator-pedal position being less than an efficiency threshold and/or a state of charge of the battery (battery SOC) being less than a first charge threshold calculated based on the measured battery capacity and the measured key-off load, output a first voltage from the battery-charging system, and is programmed to, in response to the efficiency being higher than the efficiency threshold and the battery SOC exceeding the first charge threshold but being less than a second charge threshold, output a second voltage from the battery-charging system that is less than the first voltage.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
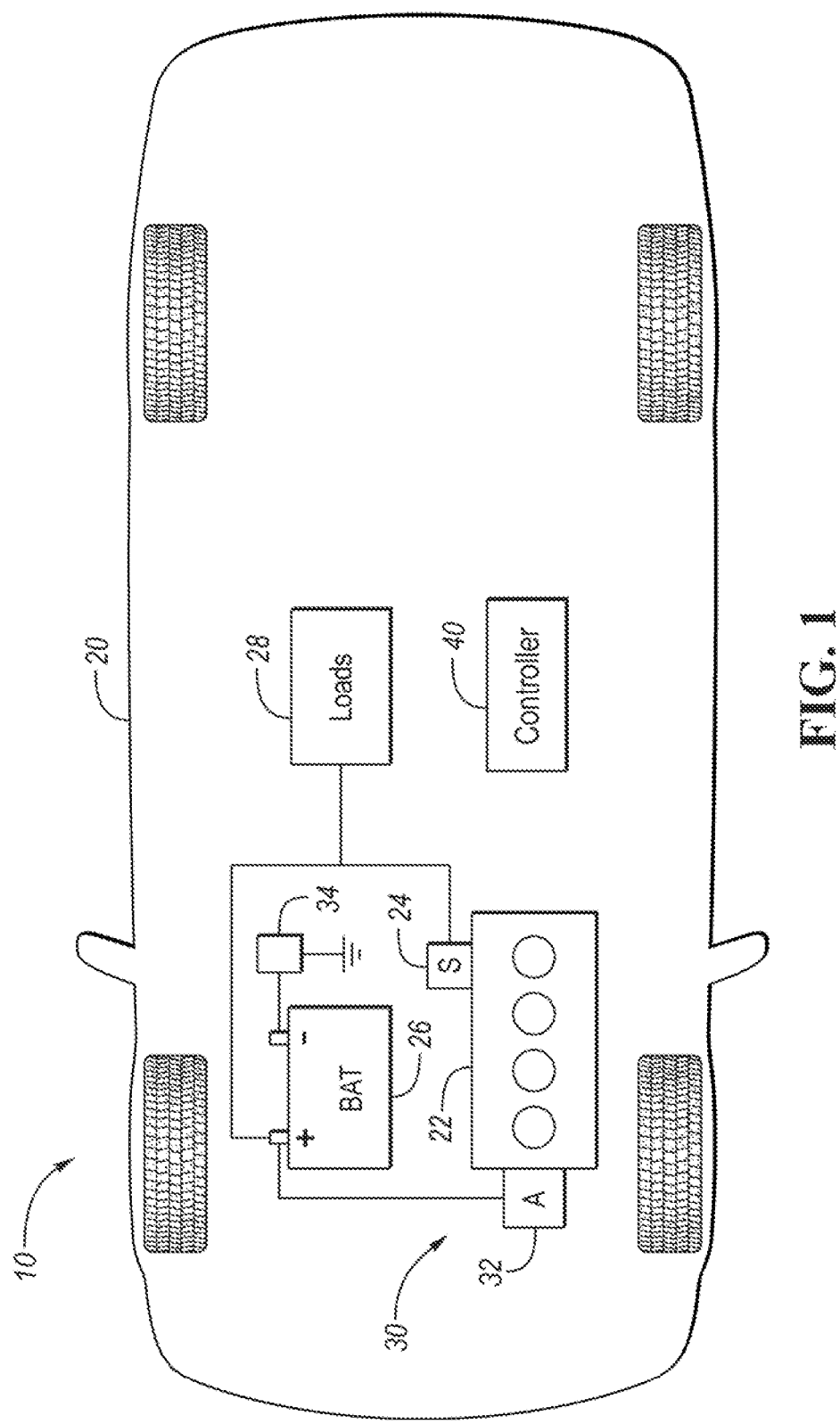
FIG. 1 is a schematic diagram of a vehicle.

Referring to FIG. 1, a vehicle 20 includes an engine 22. The engine includes a starter motor 24 used to crank the engine 22. The engine 22 may be configured for stop-start operation. The starter 24 is powered by a battery 26. The battery 26 is an electrochemical device including one or more cells that convert chemical energy to electrical energy. Most automotive batteries are 12 V but many vehicles are now being provided with higher-voltage batteries to enable start-stop operation of the engine 22 and power the ever-increasing consumption of vehicle loads 28. When the driver turns the ignition, the starter 24 draws current from the battery 26 and reduces the battery state of charge (SOC). The battery SOC is also reduced by the loads 28. A battery-charging system 30 is provided to recharge the battery. The battery-charging system 30 may include an alternator 32 (or generator) powered by the engine 22. The alternator 32 converts mechanical motion of the engine 22 into electricity. The battery-charging system 30 may also include a voltage regulator, a rectifier, and the like.

The vehicle 20 also includes one or more controllers 40 such as a powertrain control unit (PCU), a body control module (BCM), a battery monitor sensor (BMS) and others. While illustrated as one controller, the controller 40 may be part of a larger control system and may be controlled by various other controllers throughout the vehicle 20, such as a vehicle system controller (VSC). It should therefore be understood that the controller 40 and one or more other controllers can collectively be referred to as a "controller" that controls various actuators in response to signals from various sensors to control functions such as engine start-stop and battery charging. Controller 40 may include a microprocessor or central processing unit (CPU) in communication with various types of computer-readable storage devices or media. Computer-readable storage devices or media may include volatile and nonvolatile storage in read-only memory (ROM), random-access memory (RAM), and keep-alive memory (KAM), for example. KAM is a persistent or non-volatile memory that may be used to store various operating variables while the CPU is powered down. Computer-readable storage devices or media may be implemented using any of a number of known memory devices such as PROMs (programmable read-only memory), EPROMs (electrically PROM), EEPROMs (electrically erasable PROM), flash memory, or any other electric, magnetic, optical, or combination memory devices capable of storing data, some of which represent executable instructions, used by the controller in controlling the vehicle.

The controller communicates with various vehicle sensors and actuators via an input/output (I/O) interface that may be implemented as a single integrated interface that provides various raw data or signal conditioning, processing, and/or conversion, short-circuit protection, and the like. Alternatively, one or more dedicated hardware or firmware chips may be used to condition and process particular signals before being supplied to the CPU. The controller 40 may communicate signals to and/or from the engine 22, the battery-charging system 30, the battery BMS 34, the loads 28, and others. Although not explicitly illustrated, those of ordinary skill in the art will recognize various functions or components that may be controlled by controller 40 within each of the subsystems identified above.

The BMS 34 may be located on the negative terminal of the battery 26. The sensor 34 may include a current sensor, a voltage sensor, and a temperature sensor. A CPU may be housed within BMS 34. The BMS 34 is in electronic communication with the controller 40 and is configured to output one or more signals to the controller. The one or more signals may be indicative of a measured, sensed, or inferred condition of the battery 26. For example, the BMS 34 may be configured to output signals indicative of battery voltage, battery current, battery SOC, measured battery capacity, battery temperature, open-circuit voltage (OCV), internal resistance, battery state of health (SOH) and/or other parameters. The BMS module is also configured to measure a key-off load (KOL), which is the average current drain from the battery when the ignition is OFF and the vehicle is in sleep. The controller 40 may calculate the measured KOL when the vehicle is asleep. The vehicle 20 may also include a rated KOL provided by the manufacturer. Unlike the measured KOL which is dynamic, the rated KOL is constant and may deviate from the actual KOL of a given vehicle.

The controller 40 may include many signals from the various vehicle systems. Notable here, the controller 40 may receive an accelerator-pedal position signal, a brake-pedal position signal, a throttle-body opening signal, and an engine-temperature signal.

The life of the battery 26 may be dependent upon the battery SOC and the charging strategy employed. Maintaining the battery 26 at a high SOC can increase the life of the battery. Maintaining the battery at this higher SOC requires more charging from the alternator 32. Since the alternator 32 is powered by the engine, charging the battery 26 reduces fuel economy. The fuel-economy reduction is based on output voltage of the alternator, i.e., engine accessory load increases as alternator output voltage increases. The fuel economy of the vehicle can be increased by maintaining a lower target SOC for the battery. The following figures and related text describe example control strategies and vehicle systems that balance and optimize the battery-life and fuel-efficiency concerns.

The vehicle 20 may include a smart-charging strategy that outputs a higher voltage from the alternator 32 when vehicle conditions are advantageous and outputs a lower voltage from the alternator 32 when not advantageous. For example, the alternator 32 outputs a lower voltage during vehicle acceleration when the engine is consuming fuel to propel the vehicle, and outputs a higher voltage during coast/braking when so-called free energy (i.e., unwanted kinetic energy of the vehicle) is available for battery charging. When the accelerator pedal is lifted, the throttle body is mostly closed and the engine is consuming a small amount of fuel. Here, the alternator is being driven by the inertia of the vehicle, via the connection of the engine to the wheels, allowing for higher output voltage of the alternator without increasing fuel consumption. The controller 48 may be programmed to quantify this as a calculated value herein referred to as "engine efficiency" or "efficiency of the engine." The engine efficiency may be estimated by the PCM based on accelerator-pedal position, throttle-body opening, engine temperature, brake-pedal position, and the like. In other embodiments, the controller 40 may not calculate an efficiency value and rather may be simply based on a sensed condition such as accelerator-pedal position, throttle-body opening, or both. For example, the control may compare a throttle opening to an opening threshold or may compare an accelerator-pedal position to a pedal threshold. The controller 40 may be programmed with a lookup table that correlates engine efficiency to a desired alternator output voltage. In one embodiment, the lookup table includes a low voltage value and a high voltage value for the alternator. The controller 40 may command the high-value in response to the engine efficiency exceeding a threshold and may command the low value in response to the engine efficiency being less than the threshold. Alternatively, the controller may be programmed to command the high-value in response to the throttle opening (or accelerator pedal position) being less than a threshold and command the low value in response to exceeding the threshold. Of course, in other embodiments the lookup table may include a many voltage-output values that are selected based on the engine efficiency or the like.

Blindly applying the above described smart-charging strategy could result in the battery having too low a SOC when the vehicle is parked. Over time this can reduce battery life and jeopardize the ability of the battery 26 to start the engine 22 particularly if the vehicle is left unused for weeks and air temperatures are low. This smart-charging strategy may be disabled when the battery SOC drops below a minimum battery SOC threshold. The minimum SOC threshold is a dynamic value that may be based on the measured capacity of the battery and the measured key-off load, or both. Equation 1 is an example embodiment for calculating the minimum SOC threshold ($Min_{BSOC}$). In equation 1, $battery_{rated}$ is the rated capacity of the battery in ampere-hours (AmpHour), $battery_{measured}$ is the measured capacity of the battery in AmpHour, and KOL is the measured key-off load of the vehicle in milliamperes.

$$\text{Min}_{BSOC} = \frac{50 \times battery_{rated}}{battery_{measured}} + \frac{96 \times KOL}{battery_{measured}} \quad \text{(Eq. 1)}$$

Control logic or functions performed by controller 40 may be represented by flow charts or similar diagrams in one or more figures. These figures provide representative control strategies and/or logic that may be implemented using one or more processing strategies such as event-driven, interrupt-driven, multi-tasking, multi-threading, and the like. As such, various steps or functions illustrated may be performed in the sequence illustrated, in parallel, or in some cases omitted. Although not always explicitly illustrated, one of ordinary skill in the art will recognize that one or more of the illustrated steps or functions may be repeatedly performed depending upon the particular processing strategy being used. Similarly, the order of processing is not necessarily required to achieve the features and advantages described herein, but is provided for ease of illustration and description. The control logic may be implemented primarily in software executed by a microprocessor-based vehicle, engine, and/or powertrain controller, such as controller 40. Of course, the control logic may be implemented in software, hardware, or a combination of software and hardware in one or more controllers depending upon the particular application. When implemented in software, the control logic may be provided in one or more computer-readable storage devices or media having stored data representing code or instructions executed by a computer to control the vehicle or its subsystems. The computer-readable storage devices or media may include one or more of a number of known physical devices which utilize electric, magnetic, and/or optical storage to keep executable instructions and associated calibration information, operating variables, and the like.

Figure 2:
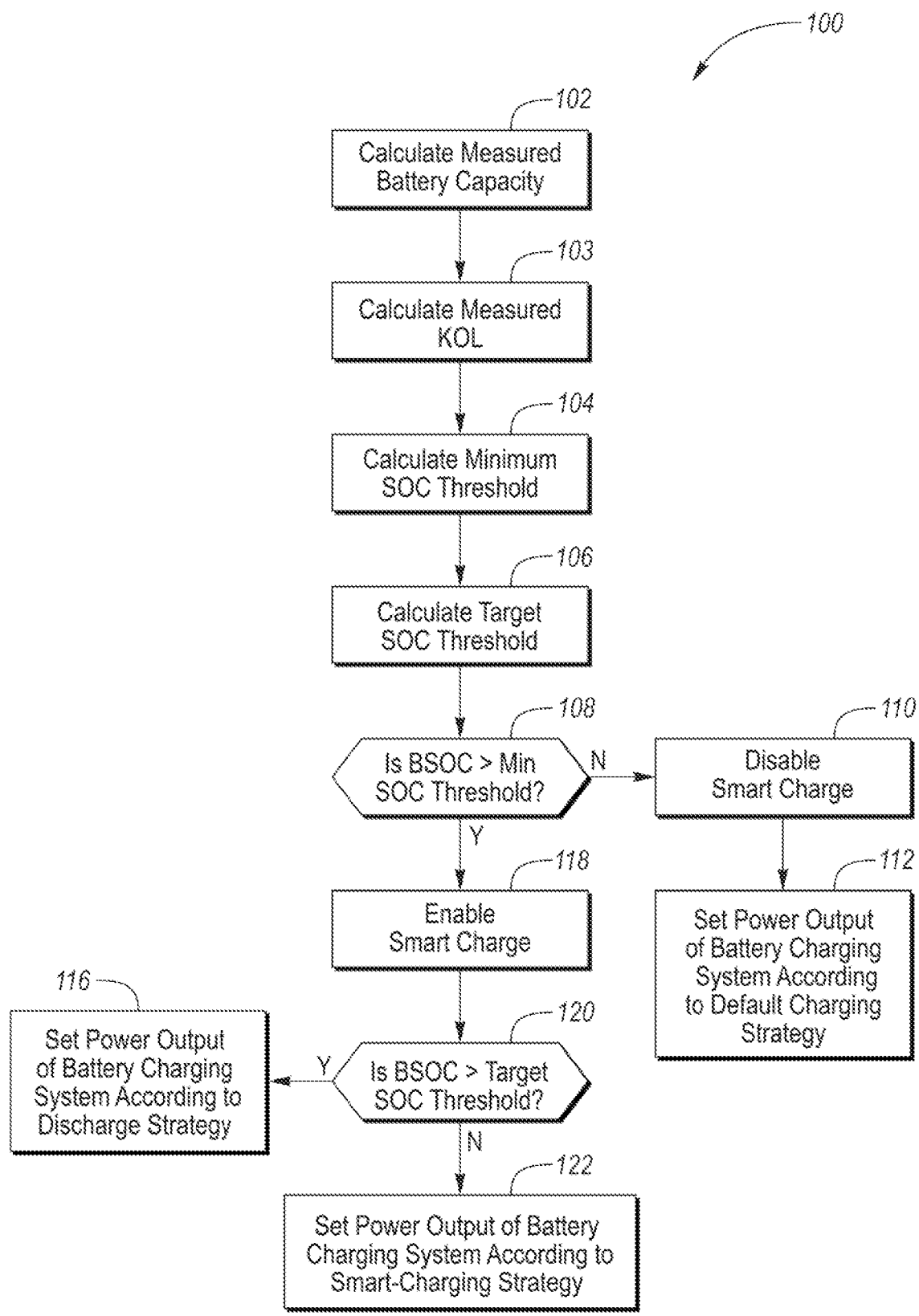
FIG. 2 is a flow chart illustrating an algorithm for setting a power output of a battery-charging system.

FIG. 2 is a flowchart 100 of an algorithm for controlling operation of the battery-charging system 30. At operation 102, the controller calculates a measured battery capacity. The measured battery capacity may be calculated by the BMS module installed on the battery poles. The measured battery capacity may be based on dynamically measured battery current, battery voltage, battery temperature, OCV, internal resistance, and/or the like. At operation 103, the controller calculates a measured key-off load. The measured key-off load may be determined by the BMS module while the vehicle is in sleep. The KOL may be determined based on measured battery drain current under key off. The measured drain current may be filtered with a large filter constant so that KOL represents battery drain current averaged with long term measurement.

At operation 104, the controller calculates the minimum battery SOC threshold. This may be calculated using equation 1 described above. At operation 106, the controller calculates the target battery SOC threshold. The target threshold may be based on the minimum threshold calculated in operation 104. The minimum threshold is set to a battery SOC determined sufficient to crank the engine even after a long park-time and cold temperatures. For example, the target threshold may be equal to the minimum threshold plus a constant. In one embodiment, the target threshold is five percent higher than the minimum threshold, e.g., if the minimum threshold is 70% then the target threshold is 75%. Five percent is just an example and other constant may be used.

At operation 108, the controller determines if the battery SOC is greater than the minimum battery SOC threshold. If no, the controller disables the smart-charging strategy to ensure that the that the battery is charged to prevent reduced life and have adequate charge for engine start. The controller employees a separate charging strategy, which may be referred to as "default-charging strategy," when the smart-charging strategy is disabled. In default charging, the alternator output is set above the battery voltage, e.g., 13 V to 15 V, so that the battery is always charging during operation of the engine. The default-charging strategy sets the voltage above the battery regardless of engine efficiency or other sensed condition but may vary a function of battery temperature. In operation 112, the controller sets the power output of the battery-charging system according to the default-charging strategy.

If yes at operation 108, control passes to operation 118 where the controller enables the smart-charging strategy. At operation 120 the controller determines if the battery SOC is greater than the target SOC threshold. If yes, control passes operation 116 and the controller sets the power output of the battery-charging system according to a discharge strategy. The discharge strategy may set voltage of the battery-charging system to be less than the voltage of the battery so that the battery is used to operate the vehicle loads to reduce the alternator load on the engine and increase fuel economy.

When the battery SOC is between the minimum threshold and the target threshold, the controller sets the power and/or voltage of the battery-charging system, e.g., the alternator, according to the smart-charging strategy. As described above, during the smart-charging strategy, the set voltage of the alternator is modified to increase fuel efficiency of the engine. The voltage is modified higher to charge more energy into battery while the engine efficiency is higher than a threshold (typically during vehicle slow-down). Therefore, less fuel from vehicle is used to charge the battery while the engine is basically driven by vehicle inertial motion and with less or even no fuel consumed by the engine. While during low engine efficiency (accelerator-pedal depressed), alternator voltage is set to a value lower than battery voltage so that the vehicle is electrically supported by the battery and there is no output from the alternator. Therefore, the engine doesn't provide torque and power to alternator during vehicle acceleration so that less fuel is consumed by the engine. Overall, smart-charging strategy charges the battery when engine efficiency is high, and discharge the battery when engine efficiency is low to reduce overall fuel consuming of the engine while the battery is still properly charged to support the vehicle electric requirement. At operation 122, the controller sets the power output of the battery-charging system, e.g., the alternator, according to the smart-charging strategy.

Figure 3:
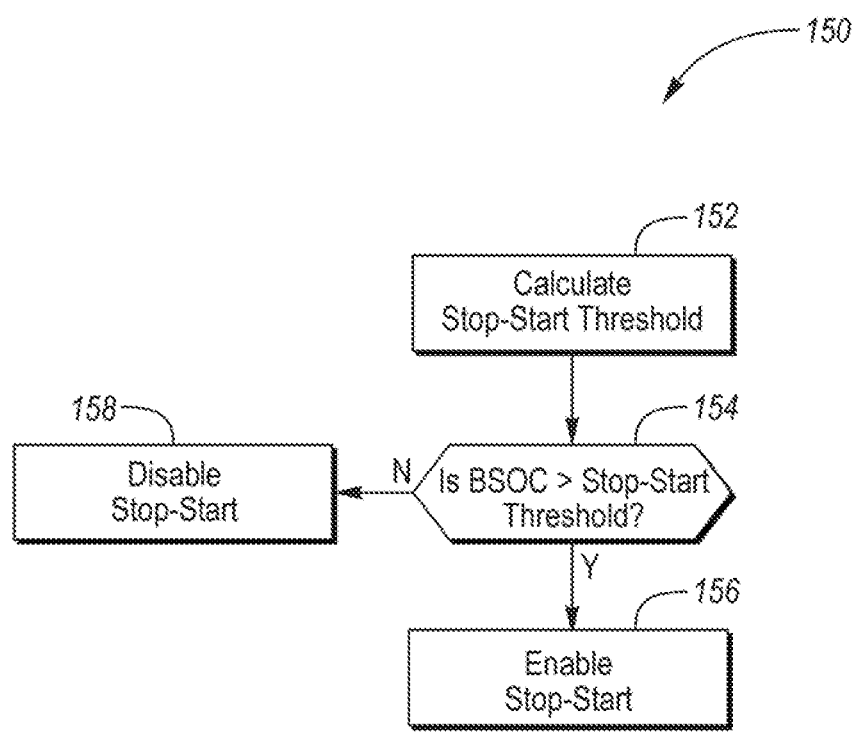
FIG. 3 is a flow chart illustrating an algorithm for controlling engine start-stop operation based on battery state of charge.

FIG. 3 illustrates a flow chart 150 for controlling operation of engine stop-start control based on the battery state of charge. At operation 152, the controller dynamically calculates a start-stop threshold that is the threshold for start-stop operation of the engine. The stop-start threshold is based on the minimum SOC threshold. According to one embodiment, the stop-start threshold is equal to the minimum SOC threshold plus a constant. For example, the stop-start threshold may be equal to the minimum SOC threshold minus five percent. This, of course, is just one example. At operation 154, the controller determines if the battery SOC is greater than stop-start threshold. If yes, start-stop is enabled at operation 156. If no, stop-start is disabled at operation 158.

The dynamically calculated minimum SOC threshold gives vehicle designers more flexibility in setting the minimum threshold since the dynamically calculated minimum SOC is based on actual measurements. This allows designers to set the minimum SOC threshold lower than a constant threshold. Reducing the minimum SOC threshold, as proposed here, allows for fuel economy improvements without risking battery performance.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A vehicle comprising:
    an engine including a throttle body;
    a battery;
    a battery-charging system electrically connected to the battery and configured to convert mechanical motion of the engine into electricity to charge the battery; and
    a controller programmed to:
    in response to an opening of the throttle body being less than an opening threshold and a state of charge of the battery (battery SOC) being less than a first charge threshold, set the battery-charging system to output a first power, wherein the charge threshold is based on a measured capacity of the battery and a measured key-off load, and
    in response to the opening being less than the opening threshold and the battery SOC exceeding the first charge threshold but being less than a second charge threshold, set the battery-charging system to output a second power that is less than the first power.

2. The vehicle of claim 1, wherein the battery-charging system includes an alternator.

3. The vehicle of claim 1, wherein the first charge threshold is further based on a ratio of a rated capacity of the battery and the measured capacity.

4. The vehicle of claim 1, wherein the first charge threshold is further based on a ratio of a rated capacity of the battery and the measured capacity plus a ratio of key-off load and the measured capacity.

5. The vehicle of claim 1, wherein the controller is further programmed to, in response to the opening exceeding the opening threshold and the battery SOC exceeding the second charge threshold, set the battery-charging system to output a third power that is less than the second power.

6. The vehicle of claim 5, wherein the second charge threshold is based on the first charge threshold.

7. The vehicle of claim 6, wherein the second charge threshold is equal to the first charge threshold plus a constant value.

8. The vehicle of claim 1, wherein the second power is based on a throttle opening of the engine and the first power is independent of the throttle opening.

9. The vehicle of claim 1, wherein a voltage of the first power is greater than a voltage of the second power.

10. The vehicle of claim 1, wherein the engine is configured for start-stop operation, and wherein the controller is further programmed to disable the start-stop operation in response to the battery SOC being less than a third charge threshold, wherein the third charge threshold is equal to the first charge threshold minus a constant value.

11. A vehicle comprising:
    an engine;
    a battery included a predetermined rated capacity;
    a battery-charging system; and
    a controller programmed to:
    calculate a minimum battery state of charge (SOC) threshold based on a measured capacity of the battery and a measured key-off load of the vehicle,
    in response to a SOC of the battery exceeding the minimum threshold, set an output voltage of the battery-charging system according to a first charging strategy that sets the output voltage based on efficiency of the engine, wherein the efficiency of the engine is based on at least throttle-body opening and accelerator-pedal position, and
    in response to the SOC of the battery being less than the minimum threshold, set another output voltage of the battery-charging system according to a second charging strategy that is independent of the efficiency of the engine.

12. The vehicle of claim 11, wherein the battery-charging system includes an alternator.

13. The vehicle of claim 11, wherein the output voltage according to the first charging strategy increase as the efficiency increases and decrease as the efficiency decreases.

14. The vehicle of claim 11, wherein the another output voltage according to the second charging strategy is independent of an operating state of the engine.

15. The vehicle of claim 11, wherein the controller is further programmed:
    calculate a target battery SOC threshold that is based on the minimum battery SOC, and
    in response to a SOC of the battery exceeding the target threshold, set yet another output voltage of the battery-charging system according to a third charging strategy such that the yet another output voltage is less than a voltage of the battery.

16. The vehicle of claim 11, wherein the engine is configured for start-stop operation, and wherein the controller is further programmed to disable the start-stop operation in response to the battery SOC being less than a start-stop threshold, wherein the start-stop charge threshold is equal to the minimum charge threshold minus a constant value.

17. A vehicle comprising:
    an engine;
    a battery including a predetermined rated capacity;
    a battery-charging system electrically connected to the battery and configured to convert mechanical motion of the engine into electricity to charge the battery; and a controller programmed to:

receive one or more signals indicative of a measured battery capacity and a measured key-off load, in response to an efficiency of the engine that is based on throttle-body opening and accelerator-pedal position being less than an efficiency threshold and a state of charge of the battery (battery SOC) being less than a first charge threshold calculated based on the measured battery capacity and the measured key-off load, output a first voltage from the battery-charging system, and in response to the efficiency being higher than the efficiency threshold and the battery SOC exceeding the first charge threshold but being less than a second charge threshold, output a second voltage from the battery-charging system that is less than the first voltage.

18. The vehicle of claim 17, wherein the controller is further programmed to, in response to the battery SOC exceeding the second charge threshold, output a third voltage from the battery-charging system that is less than the second voltage.

19. The vehicle of claim 17, wherein the first charge threshold is further based on a ratio of the rated capacity of the battery and the measured capacity.

20. The vehicle of claim 17, wherein the battery-charging system includes an alternator.

\* \* \* \* \*